US006492833B1

(12) United States Patent
Asson et al.

(10) Patent No.: US 6,492,833 B1
(45) Date of Patent: Dec. 10, 2002

(54) CONFIGURABLE MEMORY DESIGN FOR MASKED PROGRAMMABLE LOGIC

(75) Inventors: David A. Asson, Palo Alto, CA (US); James B. MacArthur, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/302,053

(22) Filed: Apr. 28, 1999

Related U.S. Application Data

(60) Provisional application No. 60/083,632, filed on Apr. 30, 1998.

(51) Int. Cl.[7] .................. H01L 25/00; H03K 19/177
(52) U.S. Cl. .................................. 326/41; 714/733
(58) Field of Search .................. 326/38–39, 41, 326/47, 40; 327/197; 377/64; 716/4, 19, 3, 16, 2, 7; 365/227, 239, 105, 111, 175, 201, 200; 714/733, 7, 6, 710, 711, 8, 42; 324/212, 760; 700/159, 79, 287, 81; 702/113; 705/32; 713/2; 369/30.04; 340/870.02; 345/82–83

(56) References Cited

U.S. PATENT DOCUMENTS

| | | | | |
|---|---|---|---|---|
| 3,829,842 A | * | 8/1974 | Langdon et al. ........ | 364/474.01 |
| 4,439,764 A | * | 3/1984 | York et al. .............. | 340/870.02 |
| 4,609,838 A | * | 9/1986 | Huang .................... | 326/39 |
| 4,812,627 A | * | 3/1989 | Wexler et al. ............ | 705/32 |
| 4,852,073 A | * | 7/1989 | Shinohara et al. ........ | 369/30.04 |
| 4,967,155 A | * | 10/1990 | Magnuson ............... | 324/212 |
| 5,041,964 A | * | 8/1991 | Cole et al. ............... | 713/322 |
| 5,105,425 A | * | 4/1992 | Brewer .................... | 714/8 |
| 5,526,278 A | * | 6/1996 | Powell .................... | 364/489 |
| 5,526,678 A | | 6/1996 | Shaw et al. | |
| 5,936,868 A | * | 8/1999 | Hall ....................... | 395/500.09 |
| 6,065,134 A | * | 5/2000 | Bair et al. ............... | 714/7 |
| 6,066,960 A | * | 5/2000 | Pedersen .................. | 326/38 |
| 6,154,837 A | * | 11/2000 | Fudeyasu et al. ........ | 713/2 |
| 6,233,191 B1 | * | 5/2001 | Gould et al. ............. | 365/220 |
| 6,249,143 B1 | * | 6/2002 | Zaveri et al. ............. | 326/39 |

OTHER PUBLICATIONS

Altera 1996 Data Book pp. 93–118.*
Altera Corporation, "FLEX 10K Embedded Programmable Logic Family", Data Sheet, Jul. 1995.
Altera Corporation, "Implementing RAM Functions in FLEX 10K Devices", Applicaiton Note 52, Nov. 1995.
Altera Corporation, "Implementing FIFO Buffers in FLEX 10K Devices", Application Note 66, Jan. 1996.
Altera Corporation, "FLEX 8000 Programmable Logic Device Family", Data Sheet, Jun. 1996.

* cited by examiner

*Primary Examiner*—Albert Decady
*Assistant Examiner*—Guy Lamarre
(74) *Attorney, Agent, or Firm*—Townsend and Townsend and Crew LLP

(57) ABSTRACT

A mask programmable integrated circuit includes a read only memory (ROM), a random access memory (RAM), and a controller. The controller couples to the ROM and RAM. The controller senses a reset condition and, in response, directs a clear of the RAM or a preload of contents of the ROM to the RAM. The preload can be performed after a successful self-test of the RAM is achieved. The RAM has a variable word length and depth size and can be configured to operate in one of many modes. The integrated circuit further includes a first and a second multiplexer (MUX). The first MUX is interposed between the RAM and the ROM, and selectively couples either the ROM data or the built-in self-test (BIST) data to the first MUX output. The second MUX is interposed between the first MUX and the RAM, and selectively couples either the output of the first MUX or a (synchronous or asynchronous) data input to the RAM. With the preload feature, the invention can emulate a ROM, a preloaded RAM, or looktip table logic functions as well as conventional RAM. Further, BIST allows for testing of the RAM without the needs for external support.

16 Claims, 5 Drawing Sheets

CONFIGURABLE MEMORY DESIGN FOR MASKED PROGRAMMABLE LOGIC

This application claims the benefit of U.S. provisional application number 60/083,632, filed Apr. 30, 1998, which is incorporated by reference.

BACKGROUND OF THE INVENTION

The present invention relates to the field of integrated circuits, and more particularly to architectures for programmable logic integrated circuits.

Programmable logic integrated circuits are well known to those in the electronic art. Such programmable logic integrated circuits are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), CPLDs (Complex Programmable Logic Devices) EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for specific applications. Such devices include, for example, the well-known Classic™, MAX®, and FLEX® families of EPLDs manufactured by Altera Corp.

The popular FLEX® PLD architecture from Altera Corp. includes many logic array blocks (LABs) arranged in a two-dimensional array and multiple embedded array blocks (EABs). This PLD architecture further includes two arrays of intersecting signal conductors for programmably selecting and conducting logic signals to, from, and between the LABs, the EABs, and the device I/O pins. Each LAB includes a number of programmable logic elements (LEs) that provide relatively elementary logic functions such as NAND, NOR, exclusive OR, flip flops, and other functions. The LABs are generally used to implement general logic and the EABs are generally used to implement memory and specialized logic functions.

A user configures a programmable logic integrated circuit, such as a PLD or a FPGA, to implement the desired logical functions. For example, the user may configure a PLD to be a microcontroller, a microprocessor, a multiplier, a digital filter, or the like. During the design phase, due to circumstances such as errors in the design or changes in requirements, the user may need to modify the design by reconfiguring the PLD. Once a particular design for the PLD has been successfully implemented and tested, the design typically does not need to be changed again. At that point, it may be desirable to reduce production costs by implementing the design in a lower cost device such as a mask-programmable PLD (MPLD).

A MPLD is a device that is configured or "hard-wired" during the fabrication of the device. For example, the PLD manufacturer fabricates a MPLD design by using a specific metal mask corresponding to the user's design. Conventionally, the conversion from a programmable design into a MPLD design is time consuming and inefficient. These design hurdles are contrary to the low cost and fast time to market requirements of many electronics products.

As can be seen, techniques for efficient conversion of a design from a programmable design to a MPLD design is highly desirable. Further, it is important that the MPLD provides the available functionality of the programmable design it replaces.

SUMMARY OF THE INVENTION

The invention provides techniques that expedite the design conversion from a PLD to a MPLD. For a MPLD conversion in accordance with the invention, the logic and interconnects of the PLD design are synthesized using conventional design conversion techniques. The embedded memories of the PLD are substituted with configurable memory blocks that provide the embedded memory features. The configurable memory block can be designed and stored in a design library, to be recalled and included in the MPLD design when needed. The contents of a ROM in the configurable memory block are altered from one MPLD design to the next.

A specific embodiment of the invention provides a mask programmable integrated circuit that includes a read only memory (ROM), a random access memory (RAM), and a controller. The controller couples to the ROM and RAM. The controller senses a reset condition and, in response, directs a clear (i.e., preload of zeros) of the RAM or a preload of contents of the ROM to the RAM. The clear or preload can be performed after achieving a successful self-test of the RAM. In an embodiment, the RAM has a variable word length and depth size and can be configured to operate in one of many modes. In an embodiment, the integrated circuit further includes a first and a second multiplexer (MUX). The first MUX is interposed between the ROM and the RAM, and selectively couples either the ROM data or the built-in self-test (BIST) data to the first MUX output. The second MUX is interposed between the first MUX and the RAM, and selectively couples either the output of the first MUX or a (synchronous or asynchronous) data input to the RAM. With the preload feature, the invention can emulate a ROM, a preloaded RAM, or look-up table logic functions as well as conventional RAM. Further, the BIST allows for testing of the RAM without the need for external support.

Another specific embodiment of the invention provides a method of initializing a mask programmable integrated circuit. The method includes: (1) resetting the mask programmable integrated circuit; (2) providing a signal to indicate a reset condition has occurred; (3) initiating a self-test of the RAMs of the mask programmable integrated circuit; and (4) when the self-test has successfully completed, preloading the RAM with contents from a ROM. The self-test of the integrated circuit typically includes performing a test of the RAM. In one embodiment, the RAM test can be performed by: (1) writing a sequence of predetermined values to the RAM; (2) reading a sequence of values from the RAM; and (3) comparing the sequence of values read from the RAM against the sequence of values written to the RAM. Alternatively, the RAM test can be achieved by performing a cyclic redundancy check (CRC) of values received from the RAM. The RAM test can also be performed using conventional RAM test algorithms.

The invention can be used to replace embedded memories (e.g., RAMs) of any PLD and integrated circuits, including microprocessors, digital signal processors, controllers, and others.

The foregoing, together with other aspects of this invention, will become more apparent when referring to the following specification, claims, and accompanying drawings.

DETAILED DESCRIPTION

The present invention allows features of embedded array blocks (EABs) in a programmable logic device (PLD) to be quickly and efficiently implemented in a low cost, masked ASIC (i.e., application specific integrated circuit). A specific example of such PLD is Altera Corp.'s Flex® 10K family of products. The Flex® 10K is described in Altera Corp., "FLEX 10K Embedded Programmable Logic Family Data Sheet," July 1995; Altera Corp., Application Note 52, "Implementing RAM Functions in FLEX 10K Devices," November 1995; and Altera Corp., Application Note 66, "Implementing FIFO Buffers in FLEX 10K Devices," January 1996, all of which are incorporated by reference.

Figure 1:
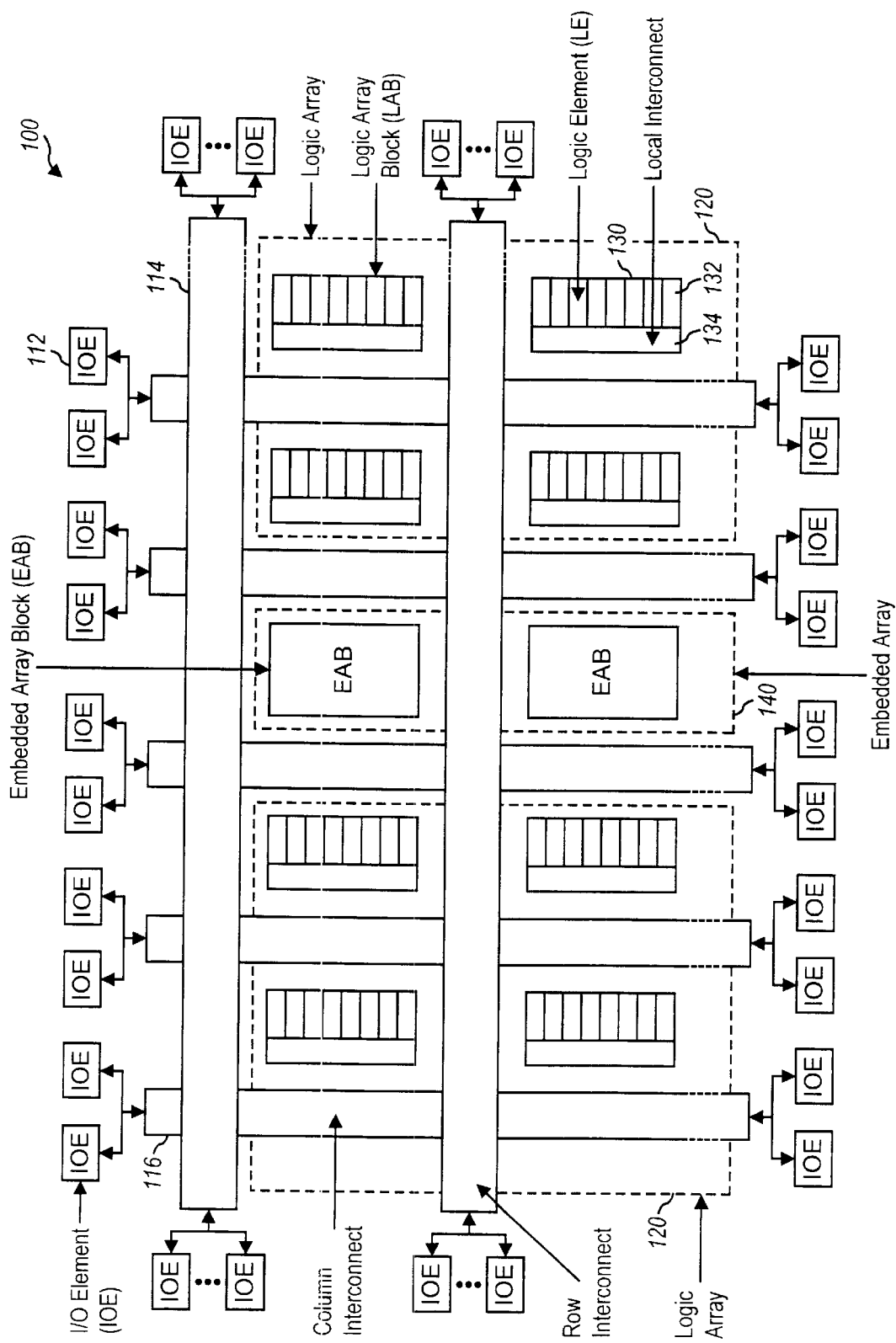
FIG. 1 shows a diagram of an embodiment of a programmable logic device PLD)

FIG. 1 shows a diagram of an embodiment of a PLD 100. Within PLD 100, a number of input/output elements (IOEs) 112 couple to a set of row interconnects 114 and a set of column interconnects 116. The row and column interconnects traverse the width and height, respectively, of the PLD and provide interconnections between and among various elements within the PLD, including IOEs 112. PLD 100 includes a number of logic arrays 120, and each logic array includes a number of logic array blocks (LABs) 130. Each LAB 130 includes a number of logic elements (LEs) 132 and a local interconnect 134 that interconnects the LEs and the row and column interconnects. PLD 100 further includes a number of embedded array blocks (EABs) 140 that also interconnect to the row and column interconnects. The LABs are typically used to implement general logic and the EABs are typically used to implement memory and specialized logic functions. This PLD architecture is that of the FLEX® 10K family which is described in further detailed in the above mentioned Altera Corp. documents.

Figure 2:
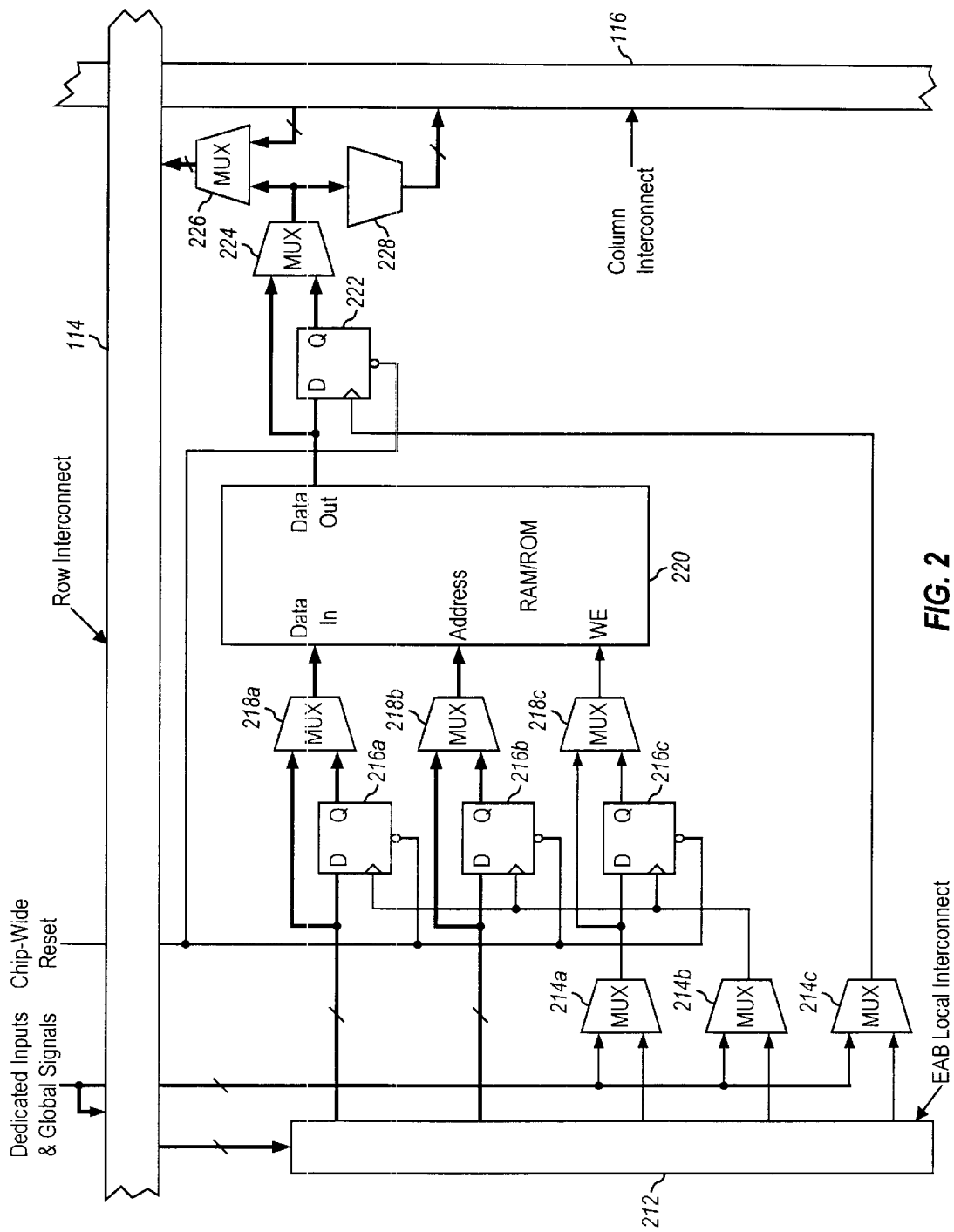
FIG. 2 shows a diagram of an embodiment of an embedded array block EAB)

FIG. 2 shows a diagram of an embodiment of EAB 140. An EAB local interconnect 212 couples to row interconnect 114, the inputs of a set of multiplexers (MUXes) 214, the data inputs of registers 216a and 216b, and the inputs of MUXes 218a and 218b. The output of MUX 214a couples to the data input of a resister 216c and the input of a MUX 218c. The output of MUX 214b couples to the clock inputs of registers 216a through 216c. The outputs of registers 216a through 216c couple to the second inputs of MUXes 218a through 218c, respectively The outputs of MUXes 218a through 218c respectively couple to the data, address, and write enable inputs of a memory 220. The data output of memory 220 couples to the data input of a register 222 and to one input of a MUX 224. The output of MUX 214c couples to the clock input of register 222. The output of register 222 couples to the second input of MUX 224. The output of MUX 224 couples to one input of a MUX 226 and to column interconnect 116 via a buffer 228. The other input of MUX 226 couples to column interconnect 116, and the output of MUX 226 couples to row interconnect 114.

Each of the registers and MUXes in FIG. 2 (except for register 216c and MUXes 214a and 218c) operates on multiple bits, as indicated by the heavy lines representing the data buses at the elements' input(s) and output. The number of bits for each bus is determined by the particular PLD design.

Memory 220 can behave as a read only memory (ROM), a random access memory (RAM), a FLASH memory, an electrically programmable ROM (EPROM), an erasable EPROM (EEPROM), or one of many other memory technologies, or a combination of the above. Memory 220 can also be implemented as a first-in first-out (FIFO) memory. FLASH, EPROM, and EEPROM are non-volatile memories. The EAB's and the MPLD memory behave like memories, except the memory contents are lost when power is removed. In an embodiment, the ROM used for the preloading is not re-writable.

As shown in FIG. 2, EAB 140 is a flexible block of RAM or ROM with registers on the input and output ports. Because of its large size and flexible interconnects, EAB 140 is often used to implement common gate array "megafunctions." For example, EAB 140 is suitable for implementing functions such as multipliers, vector scalars, error correction circuits, digital filters, and others. These functions can be combined in applications such as digital signal processors and microcontrollers.

Logic functions are implemented by programming the EAB with a read-only pattern during a configuration stage to create a large look-up table (LUT). With LUTs, combinatorial functions are implemented by looking up, rather than computing, the results corresponding to a set of inputs. This implementation of combinatorial functions can be faster than implementation of algorithms in general logic, a performance advantage that is further enhanced by the fast access times of the EAB. The large capacity of the EAB enables the user to implement complex functions in one logic level without the routing delays associated with linked LEs or FPGA RAM blocks. For example, a single EAB can implement a 4×4 multiplier with eight inputs and eight outputs. Parameterized functions such as LPM (Library of Parameterized Modules) functions can automatically take advantage of the EAB. LPM includes scalable libraries of functions (e.g., set the data width=4).

The EAB provides many advantages over conventional FPGAs, which typically implement on-board RAM as arrays of small, distributed RAM blocks. These FPGA RAM blocks contain delays that are less predictable as the size of the RAM increases. In addition, FPGA RAM blocks are prone to routing difficulties because small blocks of RAM must be connected together to create larger blocks. The small blocks of FPGA RAM are also used to implement logic, so the use of more RAM decreases the logic capacity (whereas EABs do not). In contrast, one or more EABs can be used to implement large, dedicated blocks of RAM that significantly reduce these timing and routing difficulties.

The EAB can be used to implement either synchronous or asynchronous RAM. Synchronous RAM is preferable over asynchronous RAM in many applications because of ease of use. A circuit using asynchronous RAM needs to generate a RAM write enable (WE) signal and to ensure that the data and address signals meet the setup and hold time specifications relative to the WE signal. In contrast, the EAB's synchronous RAM generates its own WE signal and is self-timed with respect to a global clock. A circuit using the EAB's self-timed RAM need only meet the setup and hold time specifications of the global clock.

Figure 3A:
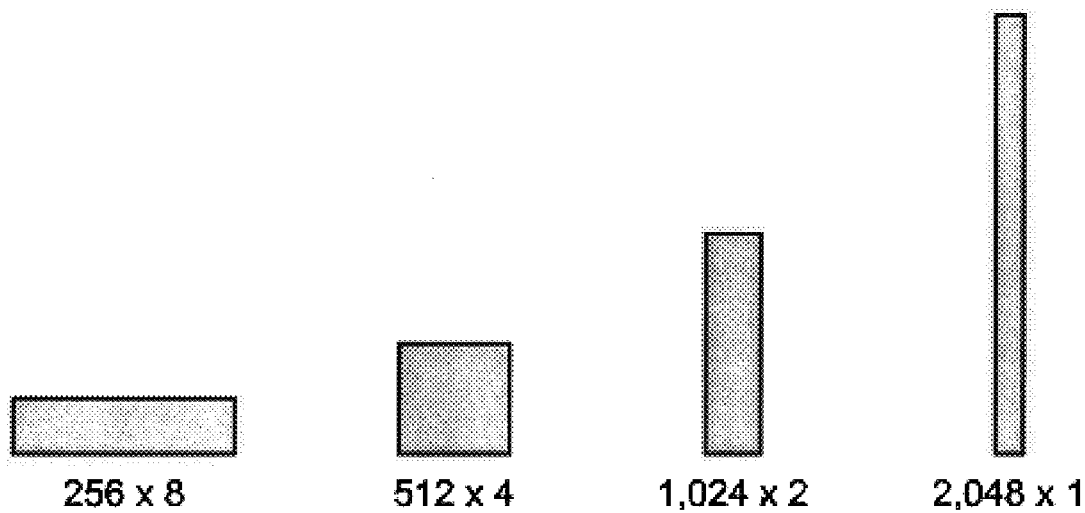
FIG. 3A shows a diagram of various configurations of the EAB's memory.

FIG. 3A shows a diagram of various configurations of the EAB's memory. When used as a RAM, ROM, or lookup table, or so on, the EAB can be configured in any of the following sizes: M×N, 2M×N/2, 4M×N/4, 8M×N/8. In a specific embodiment shown in FIG. 3A where M=256 and N=8, the EAB RAM can be configured as a 256×8, 512×4, 1024×2, or 2048×1 memory block.

Figure 3B:
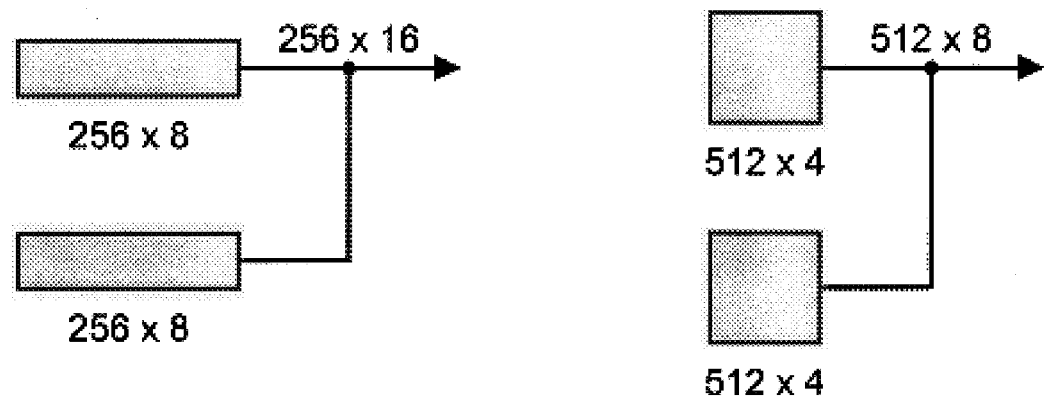
FIG. 3B shows a diagram of combinations of multiple EABs to create a larger RAM.

FIG. 3B shows a diagram of combinations of multiple EABs to create a larger RAM. For example, two 256×8

RAM blocks can be combined to form a 256×16 RAM block, or two 512×4 RAM blocks can be combined to form a 512×8 RAM block. In fact, all EABs in a PLD can be combined to form a single RAM block. Application software, such as Altera's MAX+plus II software, can automatically combine EABs to meet a user's RAM requirements.

The EABs include flexible options for driving and controlling clock and control signals. For example, different clocks can be used for the EAB inputs and outputs. The registers can be independently coupled to the EAB data input, the data output, the address input, and the WE input. Referring to FIG. 2, the global signals or the EAB local interconnect can drive the WE signal via MUX 214a. The global signals, the dedicated clock pins, or the EAB local interconnect can drive the EAB clock signals via MUXes 214b and 214c. Because the LEs drive the EAB local interconnect, the LEs can control the WE signal and the EAB clock signals.

In the embodiment shown in FIG. 2, each EAB is fed by a row interconnect and can drive out to the row and column interconnects. In an embodiment, each EAB output can drive up to two row channels and up to two column channels. The unused row channel can be driven by other LEs. This feature increases the routing resources available for EAB outputs.

The EAB architecture described above provides resources and flexibility to implement many different functions for many different applications. For example, the interconnect flexibility allows various control and data signals to be provide to and from the EAB. The EAB's flexibility is invaluable during the design phase when many iterations of changes and modifications are often performed to achieve the required functionality and to meet system specifications.

Upon completion of the design phase, it is often desirable to implement the design in a cost-effective device for production. The initial design is typically achieved using a design tool, and the design is usually expressed in a design language such as Altera hardware description language (AHDL), Verilog, VHDL languages, or schematics. To create a custom design on a particular ASIC process, the user can re-synthesizes the (e.g., Verilog) design onto the specific ASIC process.

An ASIC conversion including RAM typically requires significant additional design time for adding specific features and testability. For production devices, intelligent testability is particularly important to ensure adequate test coverage and to reduce test time, both of which impact manufacturing costs. Moreover, implementation of the specific EAB features also requires additional design time. The specific EAB features are needed to replicate the original circuit design. These conversion concerns (e.g., testability and EAB features) are addressed by the configurable memory design of the invention.

The invention provides circuits and features that facilitate conversion of a PLD design into a custom (or semi-custom) ASIC design. Specifically, the invention provides power-on reset, automatic self-test, automatic initialization, configurable word widths, and synchronous or asynchronous operation of an embedded memory within an integrated circuit. The invention can also be tailored to provide a subset of the features described above, i.e., as dictated by the particular design requirements. In an embodiment, the invention is a configurable memory block for a masked programmable logic integrated circuit that incorporate the features of the EABs described above.

Figure 4:
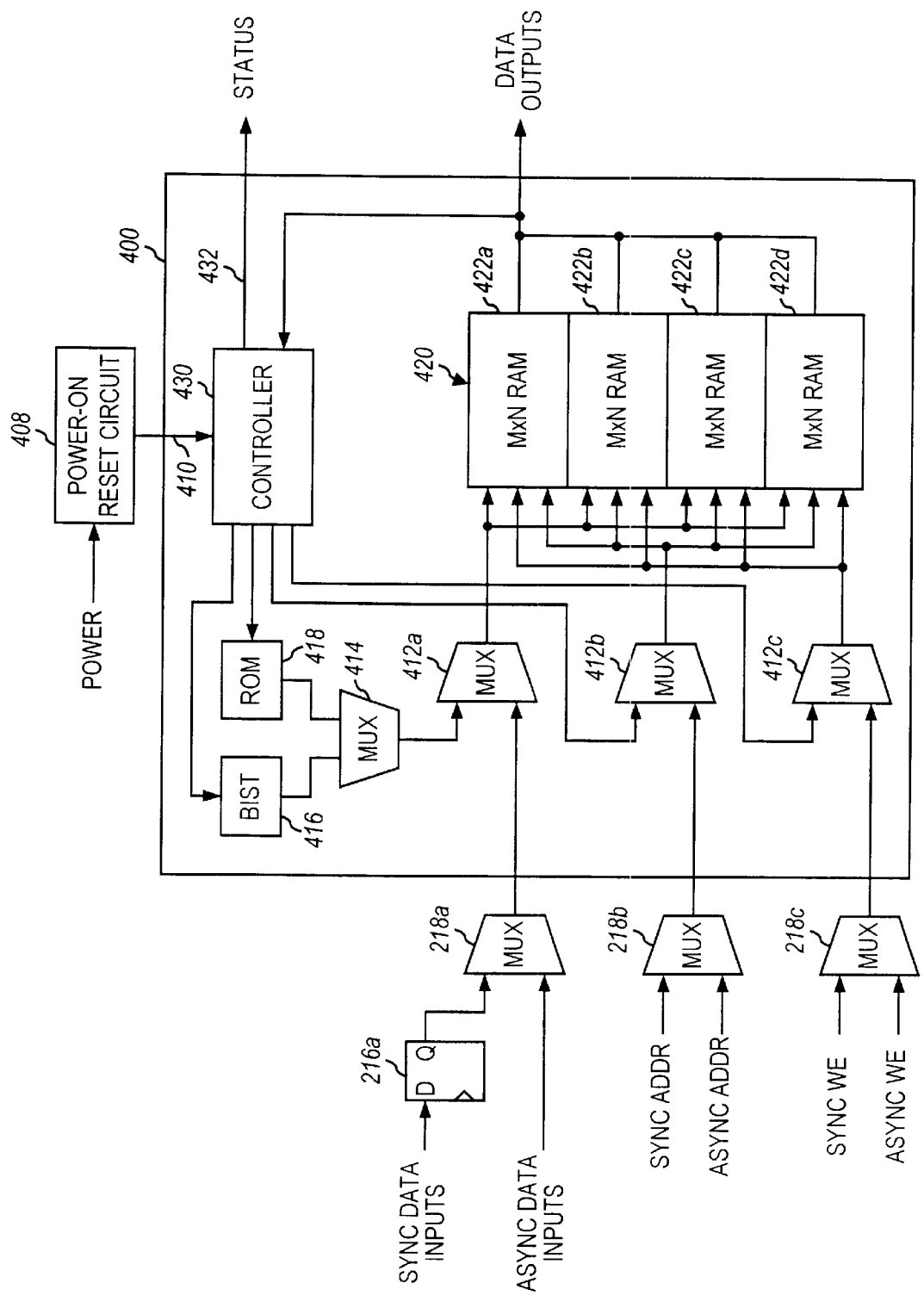
FIG. 4 shows a diagram of an embodiment of a configurable memory block of the invention.

FIG. 4 shows a diagram of an embodiment of a configurable memory block 400 of the invention. Configurable memory block 400 substitutes for memory 220 of EAB 140, and can be implemented in a MPLD. Configurable memory block 400 provides a combination of the following features: power-on reset, automatic self-test, automatic initialization, configurable word widths, and synchronous or asynchronous operation. The configurable memory block of the invention can be used to implement many functions. For example, the configurable memory block can implement an asynchronous RAM, a synchronous RAM, a ROM, a look-up table, and others.

As shown in FIG. 4, a power-on reset circuit 408 initializes the logic and starts a self-test cycle. In an embodiment, power-on reset circuit 408 resides in another section of the device and generates and provides a power-on reset signal 410 to the configurable memory block to indicate the occurrence of a reset condition. The reset condition can result from a power up of the integrated circuit, a receipt of a system reset, or the occurrence of other events. At power up, the reset condition is indicated after the power supply has reached past a predetermined voltage level and maintained above this voltage level for a predetermined time period.

Within configurable memory block 400, the data inputs are provided from MUX 218a to one input of a MUX 412a. The other input of MUX412a couples to the output of a MUX 414, and the output of MUX 412a couples to the data inputs of a memory 420. The address inputs are provided from MUX 218b to one input of a MUX 412b. The other input of MUX412b couples to a controller 430 and the output of MUX 412b couples to the address inputs of memory 420. The write enable (WE) signal is provided from MUX 218c to one input of a MUX 412c. The other input of MUX412c couples to controller 420 and the output of MUX 412c couples to the write enable inputs of memory 420. One input of MUX 414 couples to a built-in selftest (BIST) circuit 416 and a second input of MUX 414 couples to a ROM 418. BIST circuit 416 and ROM 418 also couples to a controller 430. BIST circuit 416 provides the BIST data during testing of memory 420, as described below. BIST circuit 416 is typically implemented within controller 430, but can also be implemented as a separate circuit (as shown in FIG. 4).

In the specific embodiment shown in FIG. 4, memory 420 is a RAM that is implemented using four memory blocks 422a through 422d, with each memory block 422 having a size of M×N. The data outputs of RAM 420 comprise the data Outputs of configurable memory block 400. Controller 430 also receives the BIST compare data from RAM 420 and the power-on reset signal 410 from power-on reset circuit 408. Controller 430 provides a status signal 432 to circuitry external to configurable memory block 400.

Controller 430 can be implemented in various manners. For example, controller 430 can be implemented with logic circuitry that performs the required functionality described herein. Alternatively, controller 430 can be implemented as a processor executing a set of microcodes to achieve the desired functionality.

Configurable memory block 400 operates in the following manner. Initially, controller 430 receives the signal from power-on reset circuit 408 indicating a reset condition. Controller 430 then initiates a RAM self-test to verify the integrity of the RAM. Upon completion of a successful RAM self-test, controller 430 initiates a clear of the RAM or a preload of the ROM data onto the RAM. In an embodiment, the clear is accomplished by preloading zeros into the RAM. The preload occurs by loading the contents of ROM 418 onto RAM 420 via MUXes 414 and 412b. Controller 430 can also indicate the outcome of the RAM self-test via status line 432 (e.g., high=pass, low=fail).

Controller 430 implements a built-in self test (BIST) that is initiated when a reset condition is detected. In an embodiment, the BIST includes a test of the integrity of the RAM to ensure that the RAM can properly store data and provide the data when requested. The RAM test can be achieved using one of several implementations.

In one implementation, controller 430 writes predetermined values to every location within RAM 420, reads back the values, and compares the read and written values to determine whether the memory locations are functional. The comparison can be performed by checking each read bit versus its corresponding written bit. Alternatively, the RAM testing can be achieved by performing a cycle redundancy check (CRC) of the data read from the RAM. The use of CRC for checking the validity of data is known in the art and not described in detail herein. In another implementation, the integrity of the RAM can also be verified by using conventional RAM test algorithms that are known in the art.

To further assure integrity of the RAM, different values (e.g., high and low values) can be written to each memory location and verified. Further, the memory locations can also be verified by using more than one write/read pass. Upon completion of a successful RAM test, controller 430 sends the result of the test on status line 432.

Upon completion of the BIST, RAM 420 can be cleared to a predetermined state or preloaded (i.e., initialized) with the values stored in ROM 418. RAM 420 can be cleared to all low values or all high values, as required by the system requirements. To clear or preload, controller 430 generates and provides the RAM addresses to RAM 420 via MUX 412b. Controller 430 further generates and provides the write enable signal to RAM 420 via MUX 412c. Correspondingly, controller 430 directs ROM 418 to provide the data associated with the generated addresses. The data is provided to and stored by RAM 420.

In an embodiment, clearing and preloading are performed in a parallel manner, and depend on the particular implementation of the configurable memory block. Typically, the ROM is read a word at a time and data is written to the RAM as a word. Data words are provided, one word at a time, from the ROM to the RAM. Thus, data bits are provided, one data block at a time, from the ROM to the RAM. A data block can include, for example, two, four, eight, or sixteen bits, or any other number of bits. Controller 430 generates the starting address of each block. Controller 430 also increments the RAM address accordingly.

The contents of ROM 418 are based on and define the specific user functions. Accordingly, the contents of ROM 418 are customized for each MPLD design. However, customization of ROM 418 in a MPLD design is readily achievable.

During normal operation, either the synchronous or asynchronous data input is coupled to memory 420 via MUXes 218a and 412a. Correspondingly, the synchronous or asynchronous address inputs are coupled to memory 420 via MUXes 218b and 412b, and the synchronous or asynchronous write enable signal is coupled to memory 420 via MUXes 218c and 412c. Memory 420 then functions in similar manner to the EAB it replaces, and also provides the features of the EAB.

During test and preload operations, the ROM data is provided to memory 420 via MUX 412a. Correspondingly, the RAM address is provided to memory 420 via MUX 412b, and the write enable signal is provided to memory 420 via MUX 412c. Controller 430 then directs the write and read operations on memory 420.

The invention provides many advantages over a conventional MPLD design conversion. First, the BIST incorporated into the configurable memory block allows for testing of the RAM without the needs for external support. In fact, the only test interface is the status line that indicates the outcome of the self-test. Moreover, the BIST can be designed to cover all test points of interest. In contrast, conventional PLDs and the memory within the conventional PLDs are usually tested using an externally generated test sequence that is provided to the PLD via external pins. This architecture limits accessibility to only test points accessible from the external pins. Further, testing through the external pins is typically complicated and often requires longer test times, which result in higher production costs. In a production environment, where sensitivity to cost can be more severe, longer test times are undesirable. To implement the BIST in a conventional MPLD design conversion, additional design time is typically needed to implement the self-test for that particular MPLD design.

Second, with the preload feature of the invention, configurable memory block 400 can emulate a ROM, a preloaded RAM, or look-up table logic functions as well as conventional RAM. As shown in FIG. 4, RAM 420 includes, for example, four memory blocks 422a through 422d each having a size of M×N. In a specific embodiment, each memory block has a size of 256×2 and includes eight address inputs, two data inputs, and two data outputs. Multiple memory blocks 422 can be combined to generate a larger memory block. For example, memory 400 can be configured to operate in 256×8, 512×4, 1024×2, or 2048×1 mode. In a specific implementation, the 2048×1 mode is implemented using two configurable memory blocks, and only one bit of each 256×2 RAM is used. Moreover, multiple memory blocks 422 from multiple configurable memory blocks 400 may be combined together to implement even larger memories than obtainable using a single configurable memory block 400. The memory can also be configured to operate in synchronous or asynchronous mode.

Third, the configurable memory block of the invention expedites the design conversion from PLD to MPLD. For a MPLD conversion in accordance with the invention, the logic and interconnects are synthesized using conventional design techniques and the configurable memory block substitutes for the EAB and provides the EAB features. For convenience, the configurable memory block can be designed as a design block and stored in a design library. Subsequently, the configurable memory block can be recalled from the library and included in the MPLD design when required. Only the contents of the ROM are customized for each MPLD design. This design methodology can greatly decrease the design time of the conversion from the PLD to the MPLD.

For clarity, the invention has been described in conjunction with a specific PLD architecture, namely the FLEX® 10K architecture from Altera Corp. However, the configurable memory block of the invention can substitute for embedded memories (e.g., RAMs) of any PLD and integrated circuits, including microprocessors, digital signal processors, controllers, and others.

Figure 5:
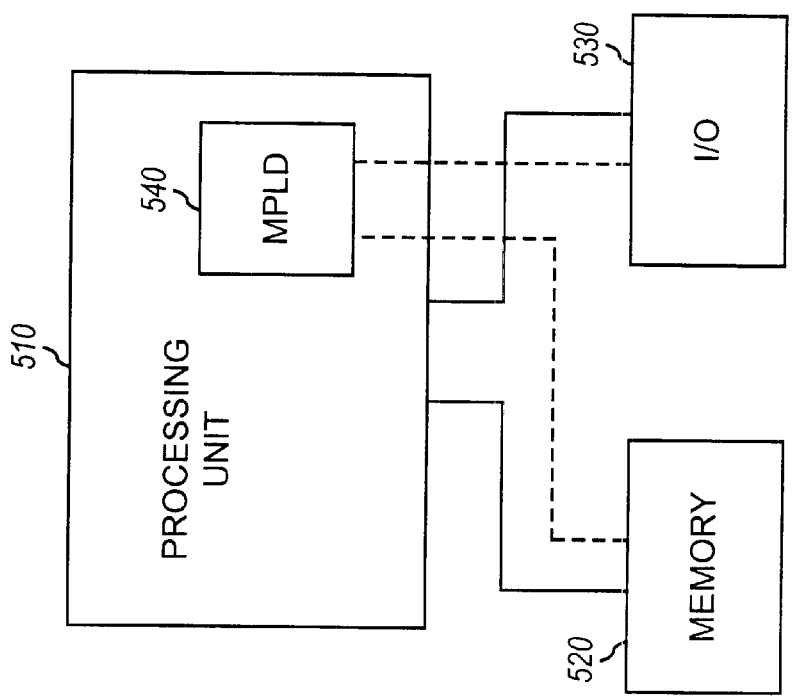
FIG. 5 shows a block diagram of a digital system within which the MPLD of the invention may be embodied.

FIG. 5 shows a block diagram of a digital system within which the MPLD of the invention may be embodied. In the particular embodiment of FIG. 5, a processing unit 510 is coupled to a memory 520 and an I/O 530 and incorporates a MPLD 540. MPLD 540 may be specially coupled to memory 520 through a connection 542 and to I/O 530 through a connection 544. The digital system may be a programmed digital computer system, a digital signal processing system, a specialized digital switching network, or other processing systems. Moreover, the digital system may be a general-purpose computer, a special purpose computer (such as telecommunications equipment) optimized for an application-specific task, or a combination of a general-purpose computer and an auxiliary special purpose hardware.

Processing unit 510 may direct data to an appropriate system component for processing or storage, execute a program stored in memory 520 or input using I/O 530, or perform other functions. Processing unit 510 may be a central processing unit (CPU), a microprocessor, a floating-point coprocessor, a graphics processor, a hardware controller, a microcontroller, or other processing units. Furthermore, in many embodiments, there is often no need for a CPU. For example, instead of a CPU, one or more MPLDs 540 may control the logical operations of the system.

In some embodiments, processing unit 510 may even be a computer system. In one embodiment, source code may be stored in memory 520, compiled into machine language, and executed by processing unit 510. Processing unit 510 need not contain a CPU and in one embodiment, instructions may be executed by one or more PLDs 540. Instead of storing source code in memory 520, only the machine language representation of the source code, without the source code, may be stored in memory 520 for execution by processing unit 510. Memory 520 may be a RAM, a ROM, a fixed or flexible disk media, a PC Card flash disk memory, tape, or any other storage retrieval means, or any combination of these storage retrieval means.

Processing unit 510 uses I/O 530 to provide input and output paths for user interaction. For example, a user may provide inputs into MPLD 540. I/O 530 may be a keyboard, mouse, track ball, digitizing tablet, text or graphical display, touch screen, pen tablet, printer, or other input or output means, or any combination of these means. In one embodiment, I/O 530 includes a printer used for printing a hard copy of any processing unit 510 output. In particular, using I/O 530, a user may print a copy of a document prepared using a word processing program executed using processing unit 510. In other cases, a user may print out a copy of the source code or a listing of the logical functions contained within MPLD 540.

MPLD may serve many different purposes within the system in FIG. 5. MPLD 540 may be a logical building block of processing unit 510, supporting its internal and external operations. MPLD 540 is designed to implement the logical functions necessary to carry on its particular role in system operation.

As some examples of the multitude of uses for MPLD 540, processing unit 510 may use MPLD 540, through connection 542, to decode memory or port addresses for accessing memory 520 or I/O 530. MPLD 540 may be designed to store data like a memory or specialized memory, where this comes from processing unit 510 or memory 520 (via connection 542). MPLD 540 may be used as a microcontroller for a memory 520 device such as a fixed or flexible disk drive. MPLD 540 may also be configured to be a microcontroller for an I/O 530 device such as a keyboard or scanner, passing data through connection 544.

In other embodiments, MPLD 540 may be used as a controller or specialized processing unit such as a coprocessor for performing mathematical or graphical calculations. In still other embodiments, MPLD 540 may be used for telecommunications applications. For example, processing unit 510 would direct data to MPLD 540; MPLD 540 processes this data; then MPLD 540 returns the results to processing unit 510. Furthermore, processing unit 510 may pass or direct a program stored in memory 520 or input using I/O 530 to MPLD 540 for execution. These are some of multitude of uses of MPLD 540 within a digital system. Also, a system such as the one shown in FIG. 5 may embody a plurality of PLDs 540, each performing different system functions.

In FIG. 5, processing unit 510 is shown incorporating MPLD 540. However, in other embodiments, MPLD 540 may be external to processing unit 510, and a MPLD interface may be coupled between processing unit 510 and MPLD 540. The MPLD interface would provide the proper adapters or sockets for interfacing MPLD 540 to processing unit 510. Moreover, the MPLD interface would provide the proper voltages and electrical characteristics for coupling MPLD 540 to processing unit 510.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A programmable integrated circuit comprising:
   a plurality of rows and columns of interconnection conductors;
   logic array blocks associated with each of the rows and columns of interconnection conductors;
   embedded array blocks in between the logic array blocks, wherein each of the embedded array blocks comprises,
   a read only memory (ROM);
   a random access memory (RAM) coupled to the ROM; and
   a controller coupled to the ROM and the RAM, wherein the controller, after a reset condition, directs a clear of the RAM or a preload of contents of the ROM to the RAM.

2. The integrated circuit of claim 1 wherein the RAM has a variable word length and depth size.

3. The integrated circuit of claim 1 wherein the RAM comprises a plurality of memory blocks.

4. The integrated circuit of claim 3 wherein each memory block has a size of M×N, and wherein the RAM can be configured to operate as M×4N, 2M×2N, 4M×N, or 8M×N/2 mode.

5. The integrated circuit of claim 4 wherein each memory block has a size of 256×2.

6. The integrated circuit of claim 1 further comprising:
   a first multiplexer (MUX) coupled between the RAM and the ROM, wherein the MUX selectively couples either an external input or the ROM to the RAM.

7. The integrated circuit of claim 6 further comprising:
   a second multiplexer (MUX) coupled between the first MUX and the RAM, wherein the first MUX selectively couples either the ROM or a built-in self-test (BIST)

circuit to the second MUX, and wherein the second MUX selectively couples either the first MUX output or the external input to the RAM.

8. The integrated circuit of claim 1 wherein lists are preloaded from the ROM to the RAM via a serial transfer.

9. The integrated circuit of claim 1 wherein a preload of data from the ROM to the RAM occurs by way of a parallel transfer of lists.

10. The integrated circuit of claim 1 wherein data outputs from the RAM are coupled to the controller.

11. The programmable integrated circuit of claim 1 wherein the programmable integrated circuit is a mask programmable integrated circuit.

12. A mask programmable integrated circuit comprising:
   a plurality of rows and columns of interconnection conductors;
   logic array blocks associated with each of the rows and columns of interconnection conductors;
   embedded array blocks in between the logic array blocks, wherein each of the embedded array blocks comprises,
      a read only memory (ROM);
      a random access memory (RAM) coupled to the ROM, wherein the RAM has a variable word length and depth size;
      a controller coupled to the ROM; and
      a multiplexer (MUX) coupled between the RAM and the ROM, wherein the MA selectively couples either an external input or the ROM to the RAM,
      wherein the controller, after a reset condition, directs a clear of the RAM or a preload of contents of the ROM to the RAM.

13. A method for forming a mask programmable integrated circuit, the method comprising:
   selecting a design for a mask programmable logic device, wherein the design includes a plurality of embedded array blocks (EABs), each of the EABs including,
      a controller coupled to a read only memory (ROM) and a random access memory (RAM), wherein the controller is configured to load data stored in the ROM into the RAM;
   selecting the data contents of the ROM for the mask programmable logic device to define specific user functions; and
   forming the mask programmable logic device according to the design.

14. The method of claim 13 wherein the controller in each of the EABs is configured to test memory locations in the RAM using a built in self-test circuit located in each of the EABs.

15. The method of claim 13 wherein data from outside each of the embedded array blocks can be stored in the RAM.

16. The method of claim 13 wherein the controller is coupled to a power-on reset circuit.

* * * * *